(12) United States Patent
Lee et al.

(10) Patent No.: US 10,468,626 B2
(45) Date of Patent: Nov. 5, 2019

(54) FLEXIBLE ORGANIC LIGHT EMITTING DISPLAY DEVICE AND METHOD OF FABRICATING THE SAME

(71) Applicant: LG Display Co., Ltd., Seoul (KR)

(72) Inventors: Jae-Young Lee, Paju-si (KR); Ji-Min Kim, Seoul (KR); Gi-Youn Kim, Goyang-si (KR); Sang-Hoon Oh, Jeollabuk-do (KR); Wan-Soo Lee, Jeonju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/288,811

(22) Filed: Oct. 7, 2016

(65) Prior Publication Data
US 2017/0125732 A1 May 4, 2017

(30) Foreign Application Priority Data

Oct. 29, 2015 (KR) ........................ 10-2015-0151286

(51) Int. Cl.
*H01L 51/52* (2006.01)
*H01L 27/32* (2006.01)
*H01L 51/00* (2006.01)

(52) U.S. Cl.
CPC ...... *H01L 51/5253* (2013.01); *H01L 27/3244* (2013.01); *H01L 51/0097* (2013.01); *H01L 2227/323* (2013.01); *H01L 2251/301* (2013.01); *H01L 2251/5338* (2013.01); *H01L 2251/5346* (2013.01); *Y02E 10/549* (2013.01)

(58) Field of Classification Search
CPC . H01L 51/5253; H01L 51/56; H01L 51/0097; H01L 27/3244; H01L 2227/323; H01L 2251/5346; H01L 2251/301; H01L 2251/5338; H01L 21/0214
See application file for complete search history.

(56) References Cited

U.S. PATENT DOCUMENTS

| 2005/0263775 | A1* | 12/2005 | Ikeda ................. G09G 3/3291 257/79 |
| 2011/0140164 | A1 | 6/2011 | Seo et al. |
| 2011/0204454 | A1* | 8/2011 | Chambers ......... H01L 21/28202 257/411 |
| 2015/0060807 | A1* | 3/2015 | Koshihara ............. H01L 27/322 257/40 |

(Continued)

FOREIGN PATENT DOCUMENTS

| CN | 102097595 A | 6/2011 |
| CN | 102244202 A | 11/2011 |
| WO | WO 03/094256 A2 | 11/2003 |

OTHER PUBLICATIONS

First Office Action for Chinese Patent Application No. CN 201610908982.3, dated Apr. 3, 2018, 16 Pages.

*Primary Examiner* — Robert T Huber
*Assistant Examiner* — Gardner W. S. Swan
(74) *Attorney, Agent, or Firm* — Fenwick & West LLP

(57) ABSTRACT

A flexible organic light emitting display (OLED) device includes an organic emitting diode on a flexible substrate, an encapsulation film covering the organic emitting diode and including a first inorganic layer and an organic layer. The first inorganic layer is formed of a first material, and at least a portion of the first inorganic layer includes a dopant that increases the surface energy of the doped material compared to that of non-doped material.

11 Claims, 7 Drawing Sheets

(56) References Cited

U.S. PATENT DOCUMENTS

| | | | |
|---|---|---|---|
| 2015/0137131 A1* | 5/2015 | Kim | H01L 51/5256 |
| | | | 257/72 |
| 2015/0380678 A1* | 12/2015 | Gong | H01L 51/5253 |
| | | | 257/40 |
| 2016/0226024 A1* | 8/2016 | Park | H01L 51/5256 |
| 2017/0117346 A1* | 4/2017 | Kim | H01L 23/49555 |
| 2017/0170428 A1* | 6/2017 | Huh | H01L 51/5253 |

\* cited by examiner

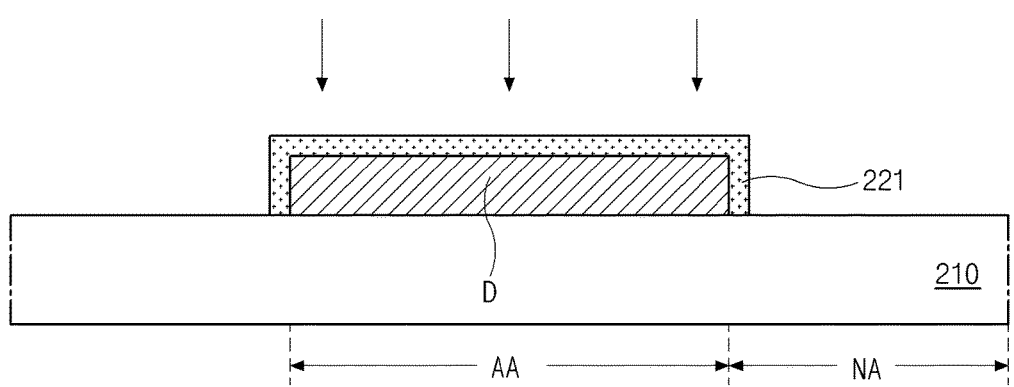
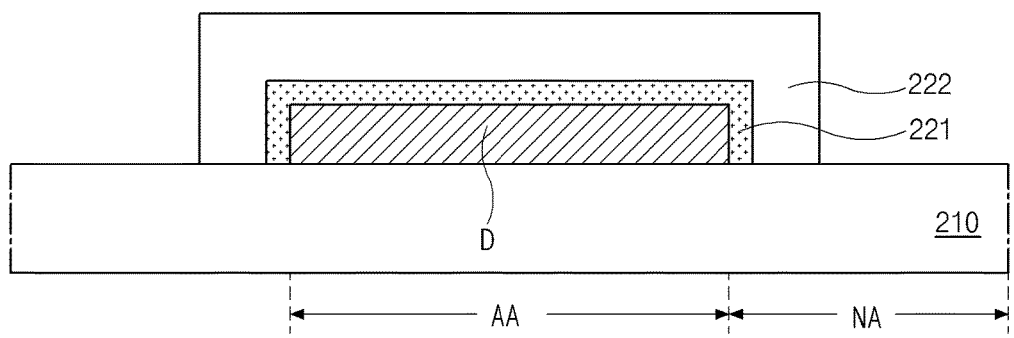

PECVD

FLEXIBLE ORGANIC LIGHT EMITTING DISPLAY DEVICE AND METHOD OF FABRICATING THE SAME

CROSS-REFERENCE TO RELATED APPLICATIONS

The present application claims the benefit of Republic of Korea Patent Application No. 10-2015-0151286 filed in the Republic of Korea on Oct. 29, 2015, which is hereby incorporated by reference in its entirety.

BACKGROUND

Field of Technology

The present disclosure relates to an organic light emitting display (OLED) device and more particularly to a flexible OLED device that prevents damage of an organic emitting diode and a display quality degradation problem.

Discussion of the Related Art

As information technology and mobile communication technology have been developed, a display device capable of displaying a visual image has also been developed. Flat panel display devices, such as a liquid crystal display (LCD) device and an OLED device, are developed and used.

Among these flat panel display devices, since the OLED device has advantages in response time, contrast ratio, viewing angle, power consumption, and so on, the OLED device is widely developed.

An emitting diode including an organic emitting layer is susceptible to damage from moisture. To prevent moisture penetration into the emitting diode and to protect the emitting diode from external impacts, an encapsulation substrate of glass is attached onto the emitting diode.

Recently, flexible, rollable, or bendable display devices (hereinafter "flexible display device") have been introduced.

In the flexible OLED device, an encapsulation film including an inorganic layer and an organic layer is used instead of the encapsulation substrate. Namely, by using the encapsulation film for preventing moisture penetration into the emitting diode and to protect the emitting diode, the display device has a flexible property.

FIG. 1 is a schematic cross-sectional view of the related art OLED device.

As shown in FIG. 1, the OLED device 1 includes a flexible substrate 10, where a display area AA and a non-display area NA at a periphery of the display area AA are defined, an organic emitting diode D on or over the flexible substrate 10 and an encapsulation film 20 covering the organic emitting diode D.

The flexible substrate 10 may include polymer such as polyimide, and the organic emitting diode D is formed on or over the flexible substrate 10. The organic emitting diode D is positioned in the display area AA, and a driving part (not shown) for driving the organic emitting diode D is positioned in the non-display area NA.

Although not shown, the organic emitting diode D may include first and second electrodes facing each other and an organic emitting layer between the first and second electrodes. In addition, on the flexible substrate 10, a switching thin film transistor (TFT) as a switching element and a driving TFT as a driving element are formed, and the first electrode of the emitting diode D is connected to the driving TFT.

The encapsulating film 20 covers the organic emitting diode D and corresponds to the display area AA and the non-display area NA. The encapsulating film 20 prevents damage to the emitting diode D under conditions of high temperature and high humidity.

In the encapsulation film 20, an inorganic layer and an organic layer are alternately stacked. For example, the encapsulation film 20 may have a triple-layered structure including a first inorganic layer 22 on the emitting diode D, an organic layer 24 on the first inorganic layer 22, and a second inorganic layer 26 on the organic layer 24.

A barrier film 30 is attached to the encapsulation film 20 using an adhesive layer 32.

However, when the flexible OLED device 1 is operated under a condition of high temperature and high humidity, the emitting diode D is still damaged resulting in problems in display quality and a lifetime of the flexible OLED device 1.

SUMMARY

Accordingly, the present disclosure is directed to a flexible OLED device and a method of fabricating the same that substantially obviate one or more of the problems due to limitations and disadvantages of the related art.

An object of the present disclosure is to provide a flexible OLED device and a method of fabricating the same being capable of preventing damage by moisture.

Another object of the present disclosure is to provide a flexible OLED device and a method of fabricating the same having a thin profile.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, a flexible organic light emitting display (OLED) device includes an organic emitting diode on a flexible substrate; and an encapsulation film covering the organic emitting diode and including a first inorganic layer and an organic layer, wherein an upper region of the first inorganic layer includes a first nitrogen-doped silicon oxide, and a lower region of the first inorganic layer includes a second nitrogen-doped silicon oxide or a nitrogen-non-doped silicon oxide.

In another aspect, a method of fabricating a flexible organic light emitting display (OLED) device includes: forming an organic emitting diode on a flexible substrate; forming a silicon oxide layer on the organic emitting layer; performing a plasma treating process onto the silicon oxide layer to form a first inorganic layer; and forming an organic layer on the first inorganic layer.

Embodiments also relate to a flexible organic light emitting display (OLED) device, that includes a flexible substrate, an organic emitting diode on the flexible substrate, and an encapsulation film covering the organic emitting diode. The encapsulation film includes a first inorganic layer including a first material and encapsulates the organic emitting diode. At least a portion of the first inorganic layer also includes a dopant that increases surface energy of the doped first material compared to surface energy of the non-doped first material. An organic layer is on the first inorganic layer.

Embodiments also relate to a method of fabricating a flexible organic light emitting display (OLED) device. An organic emitting diode is formed on a flexible substrate. A first layer of first material is formed on the organic emitting layer to encapsulate the organic emitting layer. A plasma treating process with gas containing a dopant is performed on the first layer to form a first inorganic layer having at least a portion including the dopant. The dopant increases surface energy of the doped first material compared to surface energy of the non-doped first material. An organic layer is formed on the first inorganic layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

FIGS. 7A to 7E are schematic cross-sectional views illustrating a fabricating process of a flexible OLED device according to the second embodiment of the present disclosure.

DETAILED DESCRIPTION

In the related art flexible OLED device, the damage on the organic emitting diode occurs because of a crack in the encapsulating film by particles on the organic emitting diode.

The inorganic layer of the encapsulating film contacting the organic emitting diode is formed by a plasma enhanced chemical vapor deposition (PECVD) process. The inorganic layer by the PECVD process has bad step-coverage. Accordingly, the particles on the organic emitting diode are incompletely covered by the inorganic layer such that the crack is generated in the encapsulating film. As a result, the emitting diode is damaged by heat and/or moisture under a condition of high temperature and high humidity.

An upper portion of the particles on the organic emitting diode may be completely covered by increasing a thickness of the inorganic layer. However, even with the inorganic layer having a relatively high thickness, a lower portion of the particles and an interface between the particle and the organic emitting diode are still incompletely covered. As a result, the damage on the organic emitting diode still occurs.

In addition, with the inorganic layer having a relatively high thickness, the stress on the encapsulation film is increased such that the crack may be generated in the operation of folding, bending, or rolling and the flexibility of the flexible OLED device is decreased.

Accordingly, in the related art flexible OLED device, the crack is generated in the encapsulation film such that the organic emitting diode and/or the switching and driving TFTs are damaged resulting in problems in display quality and a lifetime of the flexible OLED device.

Reference will now be made in detail to the preferred embodiments, examples of which are illustrated in the accompanying drawings.

Figure 1:
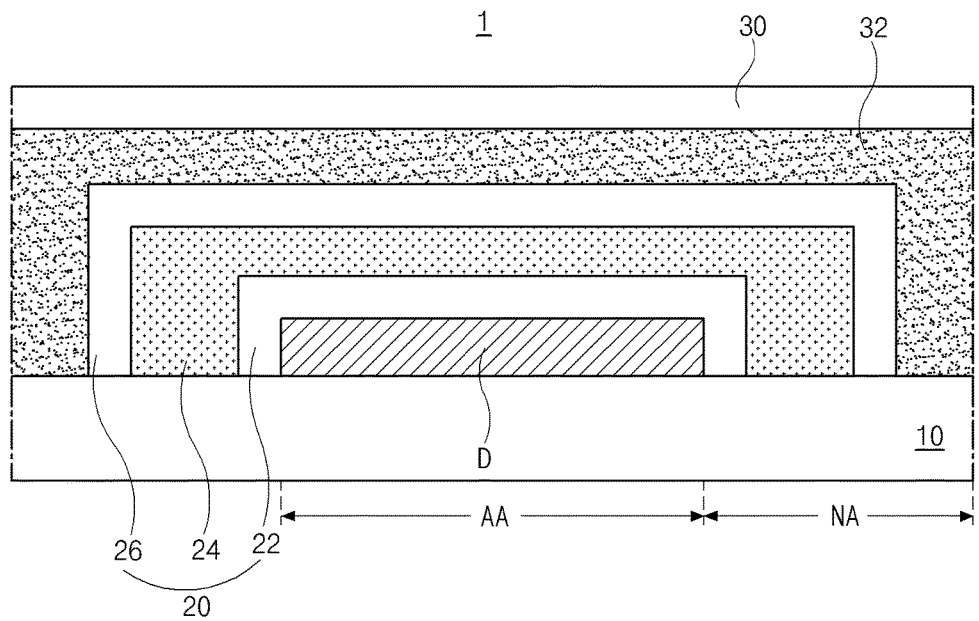
FIG. 1 is a schematic cross-sectional view of a related art OLED device.
Figure 2:
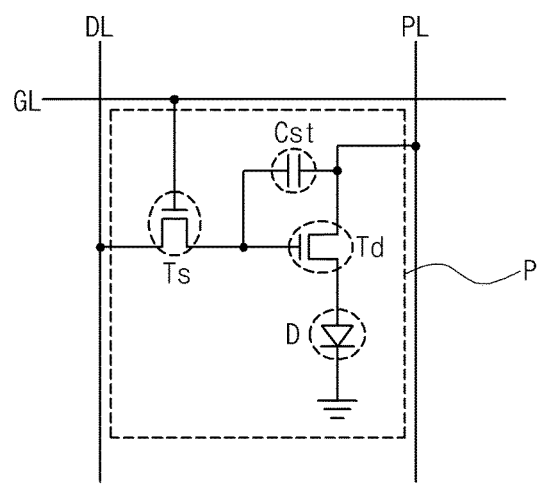
FIG. 2 is a circuit diagram of one pixel region of an OLED device according to the present disclosure.

FIG. 2 is a circuit diagram of one pixel region of an OLED device according to the present disclosure.

Referring to FIG. 2, an OLED device includes a gate line "GL," a data line "DL," a power supply line "PL," a switching thin film transistor (TFT) "Ts," a driving TFT "Td," a storage capacitor "Cst," and at least one organic emitting diode "D." The gate line "GL" and the data line "DL" cross each other to define a pixel region "P."

The switching TFT "Ts" is connected to the gate line and data line "GL" and "DL," and the driving TFT "Td" and the storage capacitor "Cst" are connected to the switching TFT "Ts" and the power line "PL." The organic emitting diode "D" is connected to the driving TFT "Td."

When the switching TFT "Ts" is turned on by a gate signal applied through the gate line "GL," a data signal from the data line "DL" is applied to the gate electrode of the driving TFT "Td" and an electrode of the storage capacitor "Cst." When the driving TFT "Td" is turned on by the data signal, an electric current is supplied to the organic emitting diode "D" from the power line "PL." As a result, the organic emitting diode "D" emits light. In this case, when the driving TFT "Td" is turned on, a level of an electric current applied from the power supply line "PL" to the organic emitting diode "D" is determined such that the organic emitting diode "D" can produce a gray scale. The storage capacitor "Cst" serves to maintain the voltage of the gate electrode of the driving TFT "Td" when the switching TFT "Ts" is turned off. Accordingly, even if the switching TFT "Ts" is turned off, a level of an electric current applied from the power supply line "PL" to the organic emitting diode "D" is maintained to the next frame.

Figure 3:
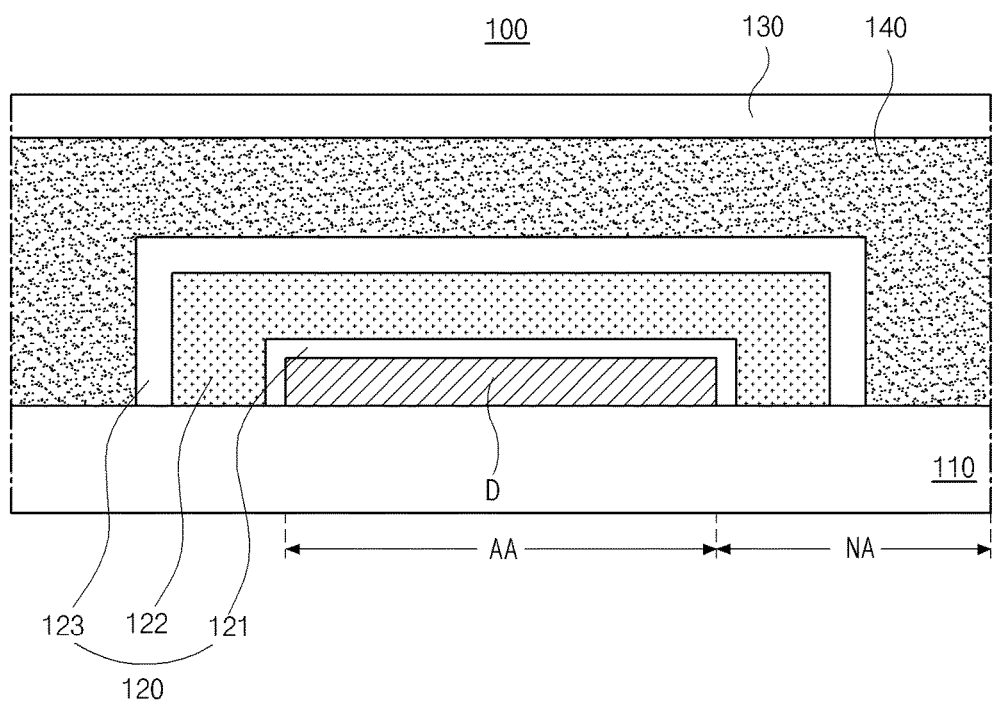
FIG. 3 is a schematic cross-sectional view of a flexible OLED device according to a first embodiment of the present disclosure.
Figure 4:
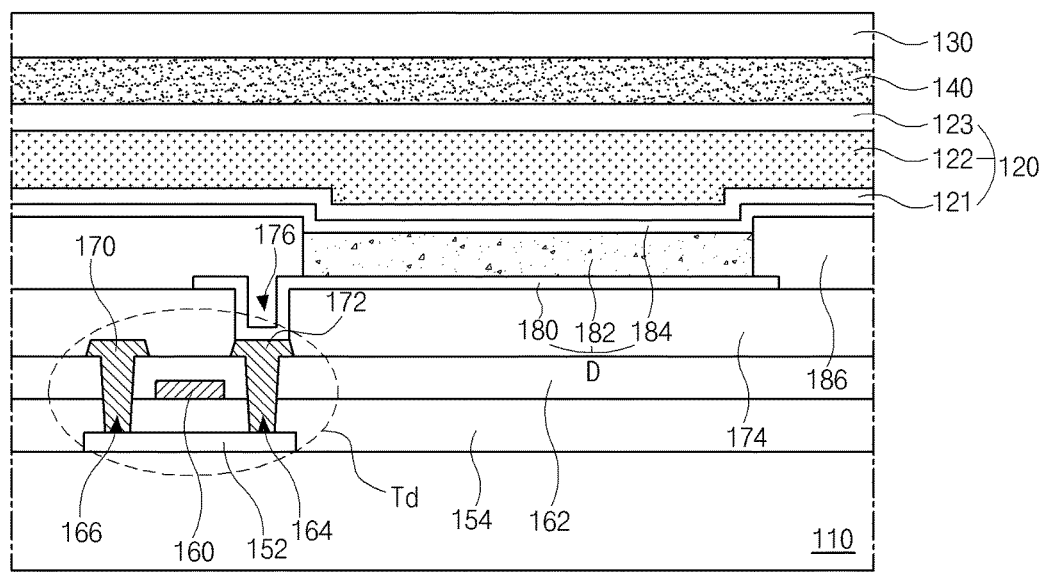
FIG. 4 is a schematic cross-sectional view showing one pixel region with an organic emitting diode according to an embodiment of the present disclosure.

FIG. 3 is a schematic cross-sectional view of a flexible OLED device according to a first embodiment of the present disclosure, and FIG. 4 is a schematic cross-sectional view showing one pixel region with an organic emitting diode according to an embodiment of the present disclosure.

As shown in FIGS. 3 and 4, a flexible OLED device 100 according to the first embodiment of the present invention includes a flexible substrate 110, where a display area AA and a non-display area NA at peripheries of the display area AA are defined, an organic emitting diode D on the flexible substrate 110, and an encapsulation film 120 covering the organic emitting diode D. A first inorganic layer 121 as a lowest layer of the encapsulation film 120 is formed by an atomic layer deposition (ALD) method.

The flexible substrate 110 may be formed of polymer such as polyimide. However, it is not limited thereto.

Although not shown, a buffer layer, which is formed of an inorganic insulating material, such as silicon oxide or silicon nitride, may be formed on the flexible substrate 110.

On the flexible substrate 110, a driving TFT Td and an organic emitting diode D are formed. In addition, a gate line (not shown) and a data line (not shown), which cross each other to define a pixel region, a power line (not shown), which is parallel to and spaced apart from the gate line or the data line, a switching TFT (not shown), which is connected to the gate and data lines, a storage capacitor (not shown), which is connected to the power line and an electrode of the switching TFT, are further formed on the flexible substrate 110.

The driving TFT Td is connected to the switching TFT and includes a semiconductor layer 152, a gate electrode 160, a source electrode 170, and a drain electrode 172.

The semiconductor layer 152 is disposed on the flexile substrate 110 and may include an oxide semiconductor material or polycrystalline silicon.

When the semiconductor layer 152 includes the oxide semiconductor material, a light-shielding pattern (not shown) may be formed under the semiconductor layer 152. The light to the semiconductor layer 152 is shielded or blocked by the light-shielding pattern such that thermal degradation of the semiconductor layer 152 can be prevented. On the other hand, when the semiconductor layer 152 includes polycrystalline silicon, impurities may be doped into both sides of the semiconductor layer 152.

A gate insulating layer 154 is formed on an entire surface of the flexible substrate 110 including the semiconductor layer 152. The gate insulating layer 154 may be formed of an inorganic insulating material such as silicon oxide or silicon nitride. For example, when the semiconductor layer 152 includes the oxide semiconductor material, the gate insulating layer 154 may be formed of silicon oxide.

A gate electrode 160, which is formed of a conductive material, e.g., metal, is formed on the gate insulating layer 154 to correspond to a center of the semiconductor layer 152. The gate electrode 160 is connected to the switching TFT.

In FIG. 4, the gate insulating layer 154 is formed on the entire surface of the flexible substrate 110. Alternatively, the gate insulating layer 154 may be patterned to have the same shape as the gate electrode 160.

An interlayer insulating layer 162, which is formed of an insulating material, is formed on an entire surface of the flexible substrate 110 including the gate electrode 160. The interlayer insulating layer 162 may be formed of an inorganic insulating material, e.g., silicon oxide or silicon nitride, or an organic insulating material, e.g., benzocyclobutene or photo-acryl.

The interlayer insulating layer 162 includes first and second contact holes 164 and 166 exposing both sides of the semiconductor layer 152. The first and second contact holes 164 and 166 are positioned at both sides of the gate electrode 160 to be spaced apart from the gate electrode 160.

In FIG. 4, the first and second contact holes 164 and 166 extend into the gate insulating layer 154. Alternatively, when the gate insulating layer 154 is patterned to have the same shape as the gate electrode 160, there may be no first and second contact holes 164 and 166 in the gate insulating layer 154.

A source electrode 170 and a drain electrode 172, which are formed of a conductive material, e.g., metal, are formed on the interlayer insulating layer 162. The drain electrode 172 and the source electrode 170 are spaced apart from each other with respect to the gate electrode 160 and respectively contact both sides of the semiconductor layer 152 through the first and second contact holes 164 and 166. The source electrode 170 is connected to the power line (not shown).

The semiconductor layer 152, the gate electrode 160, the source electrode 170, and the drain electrode 172 constitute the driving TFT Td. In FIG. 4, the gate electrode 160, the source electrode 170, and the drain electrode 172 are positioned over the semiconductor layer 152. Namely, the driving TFT Td has a coplanar structure.

Alternatively, in the driving TFT Td, the gate electrode 160 may be positioned under the semiconductor layer 152, and the source and drain electrodes 170, 172 may be positioned over the semiconductor layer 152 such that the driving TFT Td may have an inverted staggered structure. In this instance, the semiconductor layer 152 may include amorphous silicon.

The switching TFT (not shown) may have substantially the same structure as the driving TFT Td.

A passivation layer 174, which includes a drain contact hole 176 exposing the drain electrode 172 of the driving TFT Td, is formed to cover the driving TFT Td.

A first electrode 180, which is connected to the drain electrode 172 of the driving TFT Td through the drain contact hole 176, is separately formed on the passivation layer 174 in each pixel region. The first electrode 180 may be an anode and may be formed of a conductive material having a relatively high work function. For example, the first electrode 180 may be formed of a transparent conductive material such as indium-tin-oxide (ITO) or indium-zinc-oxide (IZO).

When the flexible OLED device 100 is operated in a top-emission type, a reflection electrode or a reflection layer may be formed under the first electrode 180. For example, the reflection electrode or the reflection layer may be formed of aluminum-paladium-copper (APC) alloy.

A bank layer 186, which covers edges of the first electrode 180, is formed on the passivation layer 174. A center of the first electrode 180 in the pixel region is exposed through an opening of the bank layer 186.

An organic emitting layer 182 is formed on the first electrode 180. The organic emitting layer 182 may have a single-layered structure of an emitting material layer formed of an emitting material. Alternatively, to improve emitting efficiency, the organic emitting layer 182 may have a multi-layered structure including a hole injection layer, a hole transporting layer, the emitting material layer, an electron transporting layer, and an electron injection layer sequentially stacked on the first electrode 180.

A second electrode 184 is formed over the flexible substrate 110 including the organic emitting layer 182. The second electrode 184 is positioned at an entire surface of the display area AA. The second electrode 184 may be a cathode and may be formed of a conductive material having a relatively low work function. For example, the second electrode 184 may be formed of aluminum (Al), magnesium (Mg) or Al—Mg alloy.

The first electrode 180, the organic emitting layer 182, and the second electrode 184 constitute the organic emitting diode D.

An encapsulation film 120 is formed on the second electrode 184 to prevent penetration of moisture into the light emitting diode D.

The encapsulation film 120 has a triple-layered structure of a first inorganic layer 121, an organic layer 122, and a second inorganic layer 123. However, it is not limited thereto. For example, the encapsulation film 120 may further include an organic layer on the second inorganic layer 123 to have a quadruple-layered structure or may further include an organic layer and an inorganic layer on the second inorganic layer 123 to have a five-layered structure.

The first inorganic layer 121 contacts the light emitting diode D and is formed by the ALD process to have excellent step-coverage. For example, the first inorganic layer 121 may be formed of silicon oxide (SiOx:H).

Namely, by performing the ALD process using a precursor, such as bis(ethylmethylamino)silane, diisopropylaminosilane, trimethylsilylazide or tris(dimethylamino)silane, $O_2$ reaction gas and $N_2$ purge gas, the first organic layer 121 of silicon oxide is formed. The first inorganic layer 121 may have a thickness of about 0.01 to 0.1 micrometers, and beneficially, about 0.05 micrometers.

The organic layer 122 is formed on the first inorganic layer 121. The stress applied to the first inorganic layer 121 can be reduced by the organic layer 122. For example, the organic layer 122 may be formed of an acryl-based material or an epoxy-based material.

The second inorganic layer 123 is formed on the organic layer 122. The second inorganic layer 123 is formed by the PECVD process such that a thickness of the second inorganic layer 123 is larger than that of the first inorganic layer 121. The penetration of moisture into the light emitting diode D is further prevented by the second inorganic layer 123.

For example, the second inorganic layer 123 may be formed of silicon oxide (SiOx:H), silicon nitride (SiNx:H), or siliconoxynitride (SiON). The second inorganic layer 123 may have a thickness of about 0.1 to 2 micrometers, and beneficially, about 1 micrometer.

A barrier film 130 further minimizing the moisture penetration and protecting the encapsulation film 120 may be attached onto the encapsulation film 120 using an adhesion layer 140. For example, the adhesion layer 140 may be a pressure sensitive adhesive. The penetration of moisture is further prevented by the barrier film 130, and the encapsulation film 120 is protected by the barrier film 130. The barrier film 130 and the adhesion layer 140 may be omitted.

Alternatively, a touch panel (not shown) may be attached on the encapsulation film 120 using the adhesion layer 140, and/or a polarization plate (not shown) may be further attached on an outer side of the encapsulation film 120 to reduce ambient light reflection and increase a contrast ratio. In this instance, the polarization plate may be a circular polarization plate.

As mentioned above, in the flexible OLED device 100 according to the first embodiment of the present invention, the first inorganic layer 121 as a lowest layer of the encapsulation film 120 is formed by the ALD process to have excellent step-coverage.

Accordingly, even if there are particles on the organic emitting diode D, the particles are completely covered with the first inorganic layer 121 such that there is no crack in the encapsulation film 120. As a result, the damages on an element in the display area AA, e.g., the organic emitting diode D, by moisture penetration are minimized or prevented.

In addition, since the first inorganic layer 121, which is formed by the ALD process, has a relatively small thickness with excellent step-coverage, a thickness of the encapsulation film 120 is not increased.

Namely, the flexible OLED device 100 of the present disclosure has improved displaying quality and lifetime without increasing the thickness.

However, with the first inorganic layer 121, which is formed of silicon oxide by the ALD process, there is a problem in a coating property or characteristic of the organic layer 122. As a result, there is a stain or non-uniformity (mura) problem such that the displaying quality of the flexible OLED device 100 is degraded. In addition, moisture is penetrated through an interface between the first inorganic layer 121 and the organic layer 122 such that the organic emitting diode D is damaged.

Figure 5:
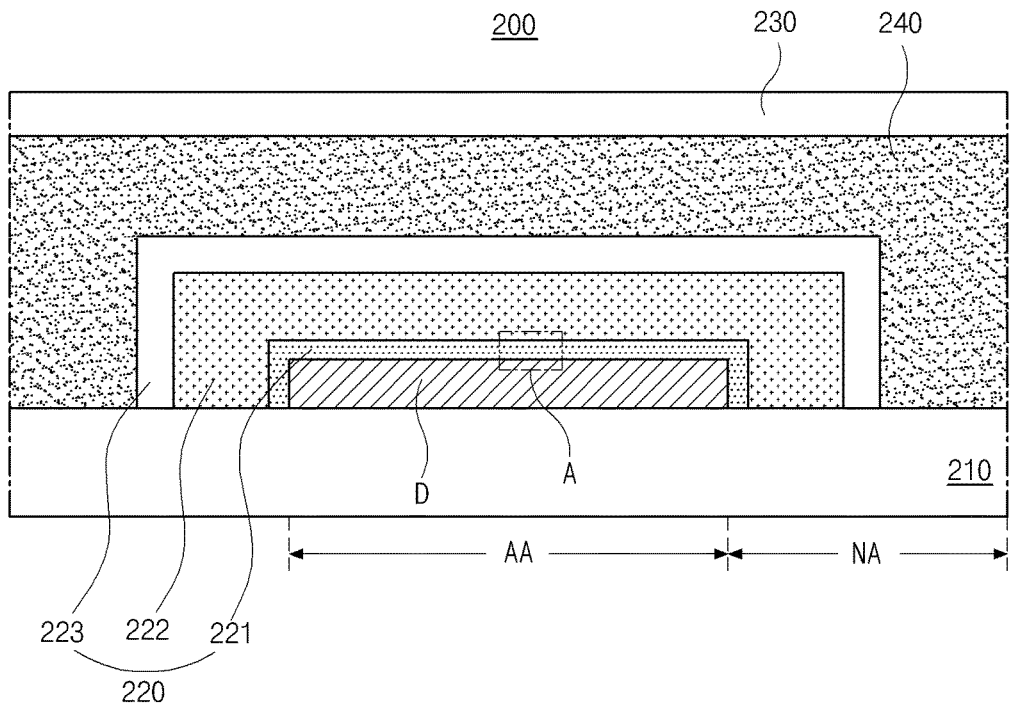
FIG. 5 is a schematic cross-sectional view of a flexible OLED device according to a second embodiment of the present disclosure.
Figure 6A:
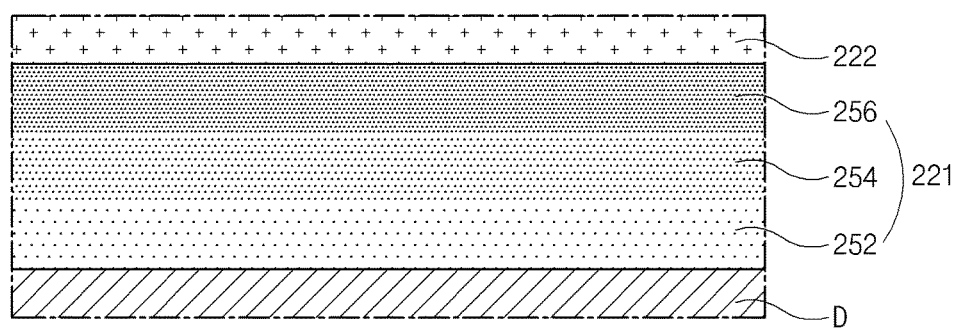
FIGS. 6A and 6B are enlarged views of part "A" in FIG. 5 according to an embodiment of the present disclosure.
Figure 6B:
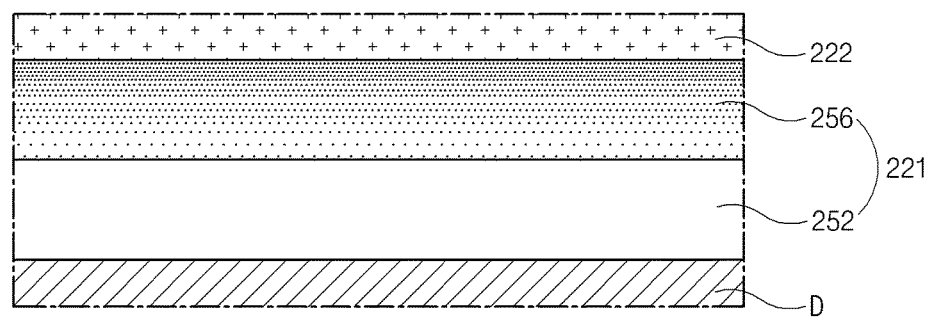

FIG. 5 is a schematic cross-sectional view of a flexible OLED device according to a second embodiment of the present disclosure, and FIGS. 6A and 6B are enlarged views of part "A" in FIG. 5 according to an embodiment of the present disclosure.

Referring to FIG. 5, a flexible OLED device 200 according to the second embodiment of the present disclosure includes a flexible substrate 210, where a display area AA and a non-display area NA at peripheries of the display area AA are defined, at least one organic emitting diode D on the flexible substrate 210, and an encapsulation film 220 covering the at least one organic emitting diode D and including first and second inorganic layers 221 and 223 and an organic layer 222. The first inorganic layer 221 as a lowest layer of the encapsulation film 220 is formed by an atomic layer deposition (ALD) method and includes at least a portion including a dopant that increases surface energy of the doped material of the first inorganic layer 221 compared to that of the non-doped material. In one particular embodiment referred throughout this application, the material of the first inorganic layer 221 is silicon oxide, and the dopant is nitrogen, and at least a portion of the first inorganic layer 221 includes nitrogen-doped silicon oxide (SixOyNz:H).

In one instance, at least the top surface of the first inorganic layer 221 includes the dopant. In one instance, the dopant may have a concentration gradient in the first inorganic layer 221. The concentration gradient may be discrete or continuous such that the concentration of the dopant increases from portions of the first inorganic layer 221 closer to the organic emitting diode D towards portions of the first inorganic layer 221 farther away from the organic emitting diode D, such as the top surface of the first inorganic layer 221.

The flexible substrate 210 may be formed of polymer such as polyimide. However, it is not limited thereto.

On the flexible substrate 210, a driving TFT Td (of FIG. 4) and an organic emitting diode D connected to the driving TFT Td are formed.

As illustrated with FIG. 4, the driving TFT Td includes the semiconductor layer 152, the gate electrode 160, the source electrode 170, and the drain electrode 172, and the organic emitting diode D includes the first electrode 180, which is connected to the drain electrode 172, the second electrode 184, which faces the first electrode 180, and the organic emitting layer 182 therebetween.

The encapsulation film 220 is formed on the organic emitting diode D to prevent the moisture penetration into the organic emitting diode D. Namely, the encapsulation film 220 covers the organic emitting diode D and extends to the non-display area NA.

The encapsulation film 220 has a triple-layered structure of a first inorganic layer 221, an organic layer 222, and a second inorganic layer 223. However, it is not limited thereto. For example, the encapsulation film 220 may further include an organic layer on the second inorganic layer 223 to have a quadruple-layered structure or may further include an organic layer and an inorganic layer on the second inorganic layer 223 to have a five-layered structure. In addition, without the second inorganic layer 223, the encapsulation film 220 may have a double-layered structure of the first inorganic layer 221 and the organic layer 222.

The first inorganic layer 221 contacts or is adjacent to the organic emitting diode D. An upper portion of the first inorganic layer 221 includes a dopant that increases surface energy of the doped material of the first inorganic layer 221 compared to that of non-doped material, and a lower portion of the first inorganic layer 221 closer to the organic emitting diode D than the upper portion includes the dopant having a concentration lower than the concentration of the dopant in the upper portion, or includes non-doped material. The upper portion may be a top surface of the first inorganic layer 221.

In one embodiment, when silicon oxide is the material of the first inorganic layer 221, and when the dopant is nitrogen, the upper portion includes a nitrogen-doped silicon oxide (SixOyNz:H), and a lower portion of the first inorganic layer 221 includes a nitrogen-doped silicon oxide (SixOyNz:H), where a nitrogen concentration in the lower portion is smaller than that in the upper portion, or non-doped silicon oxide.

Namely, the chemical formula in the upper portion of the first inorganic layer 221 may be $Si_{x1}O_{y1}N_{z1}$:H, and that of the lower portion of the first inorganic layer 221 may be $Si_{x2}O_{y2}N_{z2}$:H. The unknowns x1, x2, y1, y2, z1, and z2 meet the following:

$x1 \leq x2$, $y1 < y2$, and $z1 > z2$.

In addition, the unknowns x1, x2, y1, y2, z1, and z2 further meet the following:

$0.8 \leq x1$, $x2 \leq 1.2$, $1.4 \leq y1$, $y2 \leq 1.9$, $0 < z1 \leq 0.5$, and $0 \leq z2 \leq 0.5$.

For example, by depositing a silicon oxide layer by the ALD process and performing a plasma treating process with $NH_3$ gas, $N_2O$ gas, or $N_2$ gas onto the silicon oxide layer, the upper portion of the first inorganic layer 221 is doped by nitrogen. In this instance, the nitrogen is doped or not doped into the lower portion of the second inorganic layer 221.

In one instance, when the dopant is doped throughout the first inorganic layer 221, the dopant concentration in the upper portion is greater than that in the lower portion. Namely, the dopant has a concentration gradient in the first inorganic layer 221. The concentration gradient in the first inorganic layer 221 may be discrete or continuous such that the concentration of the dopant increases from portions of the first inorganic layer 221 closer to the organic emitting diode D towards portions farther away from the organic emitting diode D. For example, when the dopant is doped throughout the first inorganic layer 221, the concentration of the dopant may increase continually or gradually from the bottom surface of the first inorganic layer 221 adjacent to the organic emitting diode D to the top surface of the first inorganic layer 221. The top surface of the first inorganic layer 221 may have the highest concentration of the dopant in the first inorganic layer 221.

As a result, the upper portion of the first inorganic layer 221 has a surface energy being greater than the lower portion of the first inorganic layer 221.

On the other hand, when the material of the first inorganic layer 221 is silicon oxide, and the dopant is nitrogen, and the plasma treating process is performed using the $N_2$ gas, a high temperature condition is required. Namely, when the $N_2$ gas plasma treating process is performed under a low temperature condition, the desired surface modification of the silicon oxide layer is not provided. To prevent the damage on the organic emitting diode D by the high temperature process and provide the desired surface modification of the silicon oxide layer, it is preferred to perform the plasma treating process using $NH_3$ gas or $N_2O$ gas.

The first inorganic layer 221 may have a thickness of about 0.01 to 0.1 micrometers, and beneficially, about 0.05 micrometers.

The organic layer 222 is formed on the first inorganic layer 221. The stress applied to the first inorganic layer 221 can be reduced by the organic layer 222. For example, the organic layer 222 may be formed of an acryl-based material or an epoxy-based material and may be formed by one of an inkjet coating process, a slit coating process, and a bar coating process.

The second inorganic layer 223 is formed on the organic layer 222. The second inorganic layer 223 is formed by the PECVD process such that a thickness of the second inorganic layer 223 is larger than that of the first inorganic layer 221. For example, the second inorganic layer 223 may be formed of silicon oxide (SiOx:H), silicon nitride (SiNx:H), or siliconoxynitride (SiON). The second inorganic layer 223 may have a thickness of about 0.1 to 2 micrometers, and beneficially, about 1 micrometer.

Alternatively, the second inorganic layer 223 may be formed by the ALD process and may include silicon oxide (SiOx:H).

A barrier film 230 further minimizing the moisture penetration and protecting the encapsulation film 220 may be attached onto the encapsulation film 220 using an adhesion layer 240. For example, the adhesion layer 240 may be a pressure sensitive adhesive. The penetration of moisture is further prevented by the barrier film 230, and the encapsulation film 220 is protected by the barrier film 230. The barrier film 230 and the adhesion layer 240 may be omitted.

Alternatively, a touch panel (not shown) may be attached on the encapsulation film 220 using the adhesion layer 240, and/or a polarization plate (not shown) may be further attached on an outer side of the encapsulation film 220 to reduce ambient light reflection and increase a contrast ratio. In this instance, the polarization plate may be a circular polarization plate.

As mentioned above, in the flexible OLED device 200 according to the second embodiment of the present invention, the first inorganic layer 221 as a lowest layer of the encapsulation film 220 is formed by the ALD process to have excellent step-coverage.

Accordingly, even if there are particles on the organic emitting diode D, the particles are completely covered with the first inorganic layer 221 such that there is no crack in the encapsulation film 220. As a result, the damages on an element in the display area AA, e.g., the organic emitting diode D, by moisture penetration are minimized or prevented.

In addition, the upper portion of the first inorganic layer 221 of the encapsulation film 220 includes a nitrogen-doped silicon oxide such that a coating property of the organic layer 222 on the first inorganic layer 221 is improved.

There is no precursor for forming a silicon nitride layer and a siliconoxynitride layer by the ALD process and only the silicon oxide layer can be formed by the ALD process. However, when the first inorganic layer 221 of silicon oxide is formed by the ALD process without a plasma treating process, the coating property of the organic layer 222 on the first inorganic layer 221 is degraded.

However, when a dopant, such as nitrogen, is doped into a silicon oxide layer formed by the ALD process, the surface energy of the first inorganic layer 221 is increased such that the coating property of the organic layer 222 on the first inorganic layer 221 is improved. As a result, the displaying quality degradation problem in the OLED display device is prevented.

Referring to FIG. 6A, the first inorganic layer 221 includes or is divided into a lower region 252 adjacent to the organic emitting diode D, an upper region 256 adjacent to the organic layer 222, and an intermediate region 254 between the lower and upper regions 252 and 256.

In this instance, a dopant concentration in the intermediate region 254 is higher than that in the lower region 252 and smaller than that in the upper region 256. Namely, the dopant is doped throughout regions of the first inorganic layer 221 in a vertical direction, and the dopant concentration may be gradually increased from the lower region 252 to the upper region 256.

In other embodiments, the first inorganic layer 221 may include or may be divided into fewer or more regions than an upper region 256, an intermediate region 254, and a lower region 252. For example, the first inorganic layer 221 may be divided into a lower region and an upper region, in which a dopant concentration in the upper region is higher than that in the lower region. As another example, the first inorganic layer 221 may be divided into 4 or more regions in which the dopant concentration sequentially increases from the lower region to the upper region.

Referring to FIG. 6B, the first inorganic layer 221 includes or is divided into a lower region 252 adjacent to the organic emitting diode D and an upper region 256 adjacent to the organic layer 222.

In this instance, material in the lower region 252 is not doped with a dopant, and the dopant is doped into the upper region 256. In addition, in the upper region 256, the dopant concentration may be gradually increased from a bottom portion to a top portion of the upper region 256 to have a concentration gradient. For example, the dopant concentration may have a gradient from the top surface of the first inorganic layer 221 to a bottom portion of the upper region 256. In other instances, the upper region 256 may have a uniform concentration of the dopant, or may be divided into two or more regions having different dopant concentrations.

Namely, in the flexible OLED device 200 according to the second embodiment of the present invention, a top surface of the first inorganic layer 221 includes a dopant that increases surface energy of the doped material of the first inorganic layer 221 compared to that of non-doped material, and the dopant may have a concentration gradient in the first inorganic layer 221.

Accordingly, the surface energy of the first inorganic layer 221 is increased such that the coating property of the organic layer 222 on the first inorganic layer 221 is improved. As a result, the film uniformity of the organic layer 222 is improved, and the displaying quality degradation problem in the OLED display device is prevented.

Namely, since the first inorganic layer 221 by the ALD process has excellent step-coverage and a thin profile and the coating property of the organic layer 222 is improved, the flexible OLED device 200 having a thin profile without the displaying quality degradation and the damage on the organic emitting diode D is provided.

FIGS. 7A to 7E are schematic cross-sectional views illustrating a fabricating process of a flexible OLED device according to the second embodiment of the present disclosure.

Figure 7A:
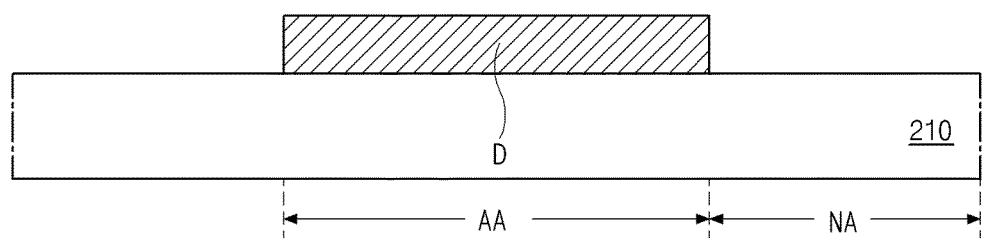

As shown in FIG. 7A, a driving TFT (not shown) is formed on the flexible substrate 210, and the organic emitting diode D is formed over the flexible substrate 210 in the display area AA.

Referring to FIG. 4, by depositing and patterning an oxide semiconductor material or polysilicon, the semiconductor layer 152 of the driving TFT DTr is formed on the flexible substrate 110. In addition, a semiconductor layer of the switching TFT is formed on the flexible substrate.

Next, an inorganic insulating material, e.g., silicon oxide or silicon nitride, is deposited to form the gate insulating layer 154 on the semiconductor layer 152.

Next, by forming and patterning a first metal layer (not shown) on the gate insulating layer 154, the gate electrode 160 of the driving TFT DTr corresponding to the center of the semiconductor layer 152 is formed. In addition, a gate electrode of the switching TFT, a gate line and a power line is formed.

Next, the interlayer insulating layer 162 is formed on the gate electrode 160, and a mask process is performed onto the interlayer insulating layer 162 and the gate insulating layer 154 to form the first and second contact holes 164 and 166 exposing both sides of the semiconductor layer 152. For example, the interlayer insulating layer 162 may be formed of an inorganic insulating material, e.g., silicon oxide or silicon nitride, or an organic insulating material, e.g., benzocyclobutene or photo-acryl.

Next, by forming and patterning a second metal layer (not shown) on the interlayer insulating layer 162, the drain electrode 172 and the source electrode 170, which respectively contact the sides of the semiconductor layer 152 through the first and second contact holes 164 and 166, are formed. In addition, source and drain electrodes of the switching TFT and a data line are formed.

Next, the passivation layer 174 is formed on the source and drain electrodes 170 and 172, and a mask process is performed onto the passivation layer 174 to form a drain contact hole 176 exposing the drain electrode 172. For example, the passivation layer 174 may be formed of an organic insulating material, e.g., benzocyclobutene or photo-acryl.

Next, a transparent conductive material layer (not shown) is formed by depositing a transparent conductive material, e.g., ITO or IZO, and is patterned by a mask process to form the first electrode 180. The first electrode 180 is connected to the drain electrode 172 of the driving TFT DTr through the drain contact hole 176.

Next, the bank layer 186, which covers edges of the first electrode 180, is formed on the passivation layer 174.

Next, the organic emitting layer 182 is formed on the first electrode 180.

Next, a metallic material, e.g., aluminum (Al), magnesium (Mg) or Al—Mg alloy, is deposited to form the second electrode 184. As a result, the driving TFT DTr and the organic emitting diode D, which is electrically connected to the driving TFT DTr, are formed on or over the flexible substrate 110.

Figure 7B:
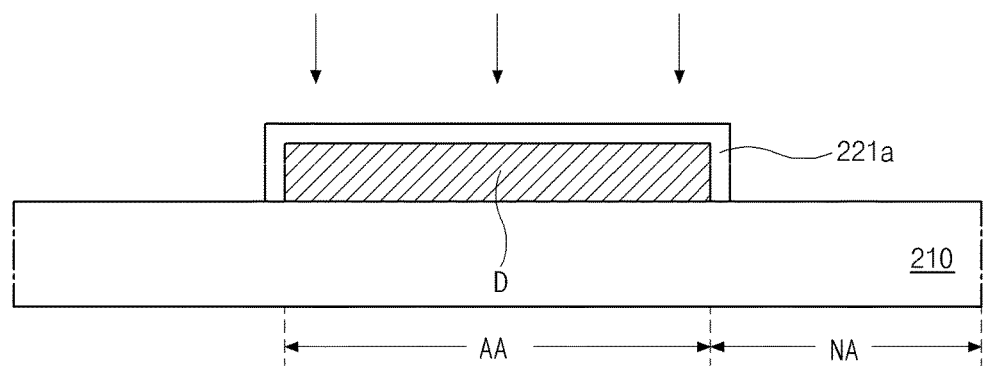

Next, as shown in FIG. 7B, a silicon oxide layer 221a covering the organic emitting diode D is formed by the ALD process.

For example, in the ALD process, a precursor, such as bis(ethylmethylamino)silane, diisopropylaminosilane, trimethylsilylazide or tris(dimethylamino)silane, $O_2$ reaction gas and $N_2$ purge gas are used to form the silicon oxide layer 221a. The silicon oxide layer 221a may have a thickness of about 0.01 to 0.1 micrometers.

Next, as shown in FIG. 7C, a surface of the silicon oxide layer 221a (of FIG. 7B) is modified by a plasma treating process using a gas containing a dopant that increases surface energy of the doped material of the layer 221a compared to that of non-doped material. In one embodiment, when the material of the layer 221a is silicon oxide and the dopant is nitrogen, the surface of the silicon oxide layer 221a is modified by a plasma treating process using $N_2$, $N_2O$ gas or $NH_3$ gas such that the first inorganic layer 221 is formed. For example, the plasma treating process may be performed under a condition of about 2800 to 3400 W for about 10 to 20 seconds.

As a result, the dopant is doped throughout the first inorganic layer 221 as shown in FIG. 6A, or the dopant is doped into the upper region except the lower region of the first inorganic layer 221 as shown in FIG. 6B.

Namely, a top surface of the first inorganic layer 221 includes the dopant, and the dopant has a concentration gradient in the first inorganic layer 221. Accordingly, the top surface of the first inorganic layer 221 has the surface energy being greater than the silicon oxide layer 221a (of FIG. 7B).

Next, as shown in FIG. 7D, the organic layer 222 is formed by coating an organic material, e.g., an acryl-based material or an epoxy-based material, on the first inorganic layer 221. For example, the organic layer 222 may be formed by an inkjet coating process.

Figure 7E:
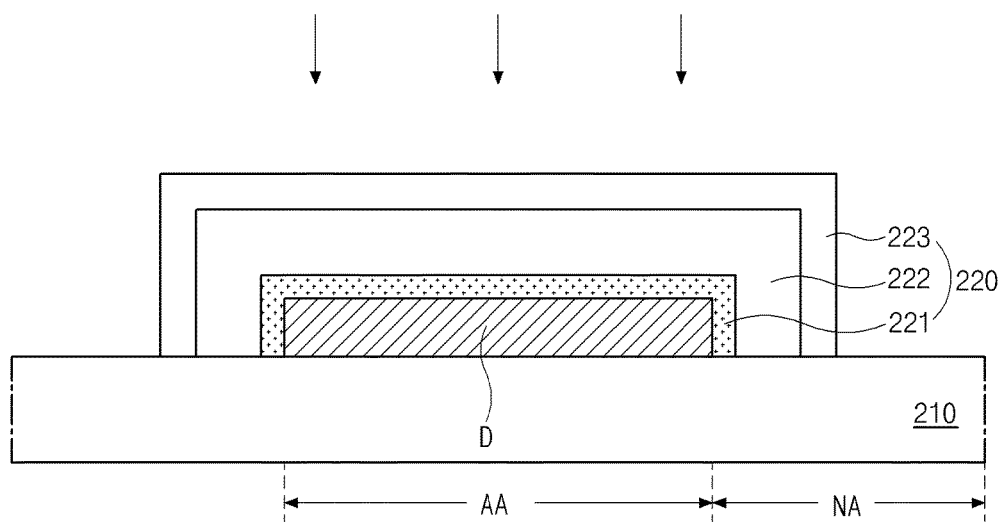

Next, as shown in FIG. 7E, the PECVD process is performed to form the second inorganic layer 223 of silicon oxide (SiOx:H), silicon nitride (SiNx:H), or siliconoxynitride (SiON) on the organic layer 222. Alternatively, the second inorganic layer 223 may be formed by the ALD process and may include silicon oxide (SiOx:H).

As mentioned above, since a dopant that increases surface energy is doped for the surface modification of the silicon oxide layer (the first inorganic layer 221), the surface energy of the first inorganic layer 221 is increased and a coating property of the organic layer 222 on the first inorganic layer 221 is improved. Accordingly, the flexible OLED device 200 having a thin profile without the displaying quality degradation and the damage on the organic emitting diode D is provided.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A flexible organic light emitting display (OLED) device, comprising:
    a flexible substrate;
    an organic emitting diode on the flexible substrate; and
    an encapsulation film covering the organic emitting diode, the encapsulation film including:
        a first inorganic layer comprising a first material and encapsulating the organic emitting diode, at least a portion of the first inorganic layer also comprising a dopant that increases surface energy of a doped first material compared to surface energy of the first material when the first material is not doped with the dopant; and
        an organic layer on the first inorganic layer,
    wherein within said portion of the first inorganic layer, a concentration of the dopant in a first portion of the first inorganic layer is higher than a concentration of the dopant in a second portion of the first inorganic layer closer to the organic emitting diode than the first portion, and
    wherein the organic layer directly contacts the first portion of the first inorganic layer.

2. The flexible OLED device of claim 1, wherein the first material is silicon oxide, and the dopant is nitrogen.

3. The flexible OLED device of claim 1, wherein the portion includes a top surface of the first inorganic layer.

4. The flexible OLED device of claim 1, wherein a concentration of the dopant in a third portion of the first inorganic layer between the first portion and the second portion is higher than the concentration in the second portion but lower than the concentration in the first portion.

5. The flexible OLED device of claim 1, wherein the second portion of the first inorganic layer includes the first material that is not doped with the dopant.

6. The flexible OLED device of claim 1, wherein the first material is silicon oxide and the dopant is nitrogen, and when a chemical formula for the doped first material in the first portion is $Si_{x1}O_{y1}N_{z1}:H$, and a chemical formula for the doped first material in the second portion is $Si_{x2}O_{y2}N_{z2}:H$, wherein $x1 \leq x2$, $y1 < y2$, and $z1 > z2$.

7. The flexible OLED device of claim 6, wherein $0.8 \leq x1$, $x2 \leq 1.2$, $1.4 \leq y1$, $y2 \leq 1.9$, $0 < z \leq 0.5$, and $0 \leq z2 \leq 0.5$.

8. The flexible OLED device of claim 1, wherein the dopant has a concentration gradient in the portion of the first inorganic layer.

9. The flexible OLED device of claim 1, wherein the encapsulation film further includes a second inorganic layer covering the organic layer and including silicon oxide, silicon nitride, or siliconoxynitride.

10. The flexible OLED device of claim 9, wherein the second inorganic layer is thicker than the first inorganic layer.

11. The flexible OLED device of claim 1, further comprising:
    a thin film transistor between the flexible substrate and the organic emitting diode; and
    a passivation layer between the thin film transistor and the organic emitting diode,
    wherein the organic emitting diode is electrically connected to the thin film transistor.

* * * * *